United States Patent
Ettenberg et al.

[11] 3,990,101
[45] Nov. 2, 1976

[54] SOLAR CELL DEVICE HAVING TWO HETEROJUNCTIONS

[75] Inventors: Michael Ettenberg, Freehold; Henry Kressel, Elizabeth, both of N.J.

[73] Assignee: RCA Corporation, New York, N.Y.

[22] Filed: Oct. 20, 1975

[21] Appl. No.: 624,310

[52] U.S. Cl. .................................. 357/30; 357/16; 357/18
[51] Int. Cl.² ........................................ H01L 27/14
[58] Field of Search ................... 357/30, 16, 19, 18

[56] References Cited
UNITED STATES PATENTS

| | | | |
|---|---|---|---|
| 3,790,868 | 2/1974 | Soshea | 317/235 R |
| 3,814,993 | 6/1974 | Kennedy | 357/30 |
| 3,852,797 | 12/1974 | Lebailly | 357/19 |
| 3,855,607 | 12/1974 | Kressel | 357/18 |
| 3,862,859 | 1/1975 | Ettenberg | 117/215 |
| 3,881,113 | 4/1975 | Rideunt | 250/551 |
| 3,902,133 | 8/1975 | Watts | 331/94.5 U |
| 3,938,172 | 2/1976 | Lockwood | 357/18 |

*Primary Examiner*—Martin H. Edlow
*Attorney, Agent, or Firm*—Glenn H. Bruestle; Daniel N. Calder

[57] ABSTRACT

A body of semiconductor material of a solar cell device has a surface a portion of which is exposed to incident solar radiation, and a surface opposite the incident surface. At the incident surface and in the body is a first region having a bandgap energy greater than 2.1 eV and thus is substantially transparent to solar radiation. Spaced from the first region and at the opposite surface is a second region which is of a material having a bandgap energy in the range of 1.5 eV to 1.9 eV. Between and in contact with both first and second regions is a third region of a material having a bandgap energy less than either the first or second regions. The third region is the most active region of the device, and the second region is substantially transparent to solar radiation not absorbed by the third region. The junction between the third region and each of the first and second regions are heterojunctions. On the opposite surface of the body is an electrode capable of reflecting back into the body of the device solar radiation passing through the second region which was not absorbed by the active region.

11 Claims, 2 Drawing Figures even3,990,101

SOLAR CELL DEVICE HAVING TWO HETEROJUNCTIONS

BACKGROUND OF THE INVENTION

The present invention relates to solar cells and more particularly to solar cells having two heterojunctions.

Semiconductor solar cells are devices that convert solar radiation energy into electrical power. This conversion of energy occurs as a result of what is well known in the solar cell field as the "photovolatic effect". Two processes are involved in the "photovolatic effect". The first process is the generation in the active semiconductor material of electrons and holes as a result of the active materials absorption of solar radiation. Secondly, the electrons and holes are separated at some electrical inhomogeneity in the solar cell device, and it is this separation which results in the generation of an electrical current. A typical electrical inhomogeneity in a solar cell device is a P-N junction.

Solar cells having a single heterojunction are well known to those in the art. Such a solar cell would typically have a region of a semiconductor material which is substantially transparent to solar radiation through which radiation first enters the solar cell. In contact with this transparent region is the solar radiation absorbing region of the device which is of one conductivity type, and spaced from the transparent region but in intimate contact with the absorbing region is a bottom region of the same material as the absorbing region but of opposite conductivity. Single heterojunction solar cells can be more efficient than silicon solar cells, but solar radiation not absorbed in the absorbing region of a single heterojunction solar cell may be absorbed in the bottom region which is of the same material as the absorbing region. Thus, there is no opportunity for this unabsorbed solar radiation to be directed back toward the absorbing region for possible absorption. We have now found that a solar cell having a double heterojunction structure can have a bottom region which will allow unabsorbed solar radiation, from the absorbing region, travel to some radiation reflector for a second pass to the absorbing region for possible absorption. Increasing solar radiation absorption in the active region of a solar cell device will increase the efficiency of the device. Any increase in solar cell efficiency is most desirable.

SUMMARY OF THE INVENTION

A solar cell device includes a body of semiconductor material having an incident surface a portion of which is exposed so as to allow solar radiation to enter the body, and a surface opposite the incident surface. A first region of one conductivity type is at the incident surface, with a second region of an opposite conductivity type spaced from the first region. Between and contiguous to each of the first and second regions is a third region. The third region forms a P-N junction in the body. On the opposite surface is a solar radiation reflecting electrode. The third region is of a material substantially uniform in composition and of a bandgap energy lower than that of either the first or second regions. The junctions between the third region and each of the first and second regions are heterojunctions. The first region is of a material having a bandgap energy greater than 2.1 eV and is consequently substantially transparent to solar radiation. The second region is of a material having a bandgap energy in the range of 1.5 eV to 1.9 eV.

DETAILED DESCRIPTION OF THE INVENTION

Figure 1:
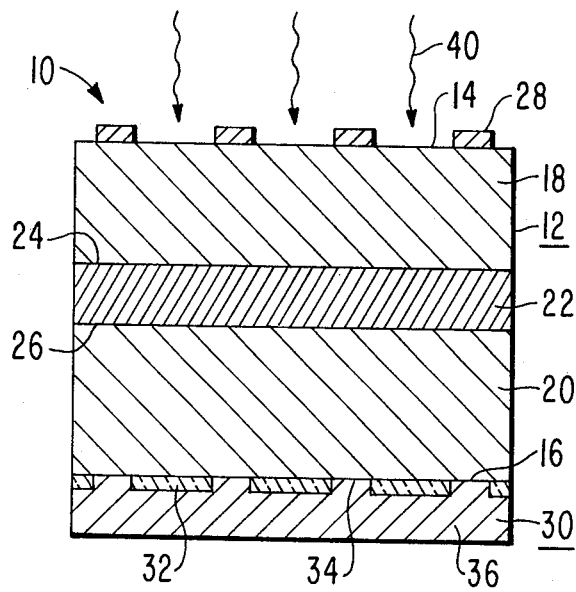
FIG. 1 is a cross-sectional view of a first embodiment of the solar cell device of the present invention.

Referring to FIG. 1, a first embodiment of the solar cell device of the present invention is designated as 10. The solar cell device 10 comprises a body 12 of semiconductor materials having the capability of converting solar energy into electrical power, such as the III–V semiconductor materials and their alloys. A surface 14 of the body 12 is the surface, a portion of which is exposed so as to allow solar radiation 40 to enter the semiconductor device 10. Opposite the incident surface 14 of the body 12 is a surface 16. The body 12 includes a first region 18 of one conductivity type at the solar radiation incident surface 14 and a second region 20 of an opposite conductivity type spaced from the first region 18 and at the opposite surface 16. Between and contiguous to both the first region 18 and the second region 20 is a third region 22. The third region 22 is of the same conductivity type as the second region 20 and of a material substantially uniform in composition. Thus the junction between the first region 18 and the third region 22 is a P-N junction 24. For the purpose of explaining the solar cell 10 of the present invention the first region 18 is of N type conductivity and the second and third regions 20 and 22 are of P type conductivity.

The semiconductor material of the first region 18 and second region 20 differs in composition from the semiconductor material of the third region 22. Therefore the PN junction 24 and a junction 26 between the third region 22 and the second region 20 are heterojunctions. The first region 18 is of a semiconductor material, preferably of the III–V group, which is substantially transparent to solar radiation. Since the solar radiation which is incident onto the device 10 is typically in the range of 4000A to 9000A the semiconductor material of the first region 18 will be of a high bandgap energy, i.e., greater than 2.1 eV. The third region 22 is the region where substantially most of the solar radiation absorption in the device 10 occurs. Thus, the third region 22 is of a semiconductor material having a bandgap energy such that it will absorb most of the incident radiation. It is well known to those in the solar cell art that the most efficient absorption of solar radiation occurs in semiconductor materials having a bandgap energy in the range of 1.4 eV, such as GaAs. As for the second region 20 it must be substantially transparent to the solar radiation not absorbed by the third region 22, but of a bandgap energy such that a potential barrier is formed at the heterojunction 26 for purposes which will be discussed subsequently. It is desirable that the second region 20 be of a semiconductor material having a bandgap energy in the range of 1.5 to 1.9 eV.

For the purpose of explaining the solar cell device 10 of the present invention it is preferred that the third region be of gallium arsenide, GaAs. It is most desirable that the material of the first region 18 and the second region 20 be lattice matching with the material of the third region 22. Lattice matching between the third region 22 and each of the first and second regions 18 and 20 is an important factor in preventing strains and dislocations from forming in the body 12. Thus, it is preferable that the first region 18 and second region 20 be of aluminum gallium arsenide, but of different aluminum concentrations. Since the first region 18 is required to have a higher bandgap energy than the second region 20, typically the first region 18 will be of $Al_xGa_{1-x}As$ wherein $x$ is greater than 0.5 but less than 1, and the second region 20 will be of $Al_yGa_{1-y}As$ wherein $y$ is in the range of 0.1 to 0.4. Other semiconductor materials which are lattice matching to GaAs and could be utilized are indium gallium arsenide phosphide, or indium aluminum arsenide phosphide.

On the incident surface 14 of the body 12 is an electrode 28. Typically the electrode 28 is in the form of a grid and covers no more than about 5% to 10% of the surface area of the incident surface 14. Keeping the surface area, on which the grid electrode 28 is on the incident surface 14, at a minimum allows as much solar radiation 40 to enter the solar cell device 10 as possible. At the opposite surface 16 is a solar radiation reflecting electrode 30. Typically, the reflecting electrode 30 functions both as a collector of current and a reflector of solar radiation not absorbed by the third region 22. The reflecting electrode 30 includes a non-continuous layer 32 of an insulating material such as silicon dioxide on the opposite surface 16. The non-continuous layer 32 is non-continuous because of openings 34 which are in the form of a grid pattern. In the openings 34 at the opposite surface 16, and on the non-continuous insulating layer 32 is a metallic layer 36. The metallic layer 36 if of a metal or metals having good electrical conduction properties and is reflective to solar radiation. As an example, the metallic layer 36 may be of a first layer of chromium directly on the opposite surface 16 and non-continuous insulating layer 32 with a second layer of a metal such as gold on the layer of chromium. While the gold is an excellent electrical conductor the chromium aids in the adhesion of the gold to the device 10.

In the operation of the solar cell device 10 solar radiation 40 first strikes the device 10 at the incident surface 14 and enters the first region 18. As previously stated the first region 18 is of a material having a bandgap energy greater than 2.1 eV, thus being substantially transparent to the solar radiation 40 which is predominately in the frequency range of 4000A to 9000A.

After the vast majority of the solar radiation 40 passes through the first region 18, it enters the third region 22, which is preferably GaAs. Gallium arsenide has a bandgap energy of approximately 1.4 eV and is capable of absorbing solar radiation below 9000A. As the solar radiation 40 passes through the third region 22, it is substantially absorbed and electron-hole pairs are formed.

As is well known in the semiconductor art there exists an electric field at the P-N junction 24. The minority carrier generated in the third region 22, in this case electrons, which are in the vicinity of the P-N junction 24 are swept by the electric field across the P-N junction 24. Preferably the third region 22 is no thicker from the P-N heterojunction 24 to the heterojunction 26 than the diffusion length of minority carrier in the third region. The displacement of these electrons across the P-N junction 24 results in the generation of an electric current. Since the junction 26 is a heterojunction having a potential barrier as a result of the second region 20 possessing a higher bandgap energy than the third region 22, minority carriers generated in the third region 22 and near the heterojunction 26 are repelled toward the P-N junction 24. This repelling of the minority carriers at the heterojunction 26 increases the minority carrier collection efficiency at the P-N junction 24.

In addition, as a result of the second region 20 having a bandgap energy higher than that of the third region 22, solar radiation not absorbed by the third region 22 will probably not be absorbed by the second region 20. This unabsorbed radiation passing through the second region 20 will next strike the reflecting electrode 30 and be reflected back into the third region 22 for possible absorption. The unabsorbed solar radiation will pass through the non-continuous insulating layer 32, which is transparent to solar radiation, but it is upon striking the metallic layer 36 which reflects the radiation back into the body 12. If the metallic layer 36 were in intimate contact with the second region 20 instead of the insulating layer 32 in the deposition of the metallic layer 36 a thin alloy layer would form between the layer 36 and the semiconductor material of the second region 20. Such an alloy layer will usually itself absorb solar radiation incident onto it, resulting in the loss of solar radiation which is not absorbed within the semiconductor material of body 12. Wherever the insulating layer 32 is an intermediate between the second region 20 and the metallic layer 36, no alloy layer, absorbing solar radiation, is formed. Therefore, the alloy layer will only be formed where metallic layer 36 is in openings 34 and on the second region 20, which accounts for only a small portion of the second region 20 at the opposite surface 16.

It is also conceivable that solar radiation not absorbed by the third region 22 on this second pass may strike the incident surface 14 at an angle greater than the critical angle and again be reflected back into the body 12.

The solar cell device 10 may be made by epitaxially depositing the regions on a substrate, such as GaAs with the second region 20 being deposited first then the third region 22 on the second region 20 and finally the first region 18 on the third region 22. The regions are preferably deposited by liquid phase epitaxy although they may be deposited by vapor epitaxial techniques well known in the art. The regions may be sequentially deposited on the substrate by liquid phase epitaxy by using the method and apparatus described in U.S. Pat. No. 3,897,281, issued July 29, 1975 to S. L. Gilbert et al. entitled "Method For Epitaxially Growing A Semiconductor Material On A Substrate From The Liquid Phase."

In the method described in U.S. Pat. No. 3,897,281 charges of the semiconductor material and conductivity modifiers to be deposited are placed in the wells of a refractory furnace boat. A substrate is placed in a slide which extends longitudinally through the boat and across the bottom of the wells. The boat and its contents are heated to a predetermined temperature at which the charges become molten. After reaching the predetermined temperature the slide is moved into a first well and the boat and its contents are cooled. During the cooling of the molten charge the semiconductor material is deposited onto the substrate. The substrate is sequentially moved into the remaining wells while the furnace contents are cooled for the further deposition of the semiconductor material in the wells.

After the substrate with the epitaxially grown regions is removed from the furnace the substrate is mechanically or chemically removed by techniques such as grinding or etching, leaving only the body 12. Next, the grid electrode 28 is formed by evaporating a metallic layer onto the incident surface 11 of body 12 and by etching techniques well known in the art a grid pattern is formed into the metallic layer. A layer of insulating material, such as silicon dioxide, is then deposited on the opposite surface 16 of the body 12, and openings in the form of a grid pattern are made in the insulating layer by well known masking and photoresist techniques, thereby forming the non-continuous insulating layer 32. In the openings and on the non-continuous insulating layer 32 is evaporated the metallic layer 36.

In describing the solar cell device 10 of the present invention it was assumed that the first region 18 was of N-type conductivity and both the third and second regions 22 and 20 were of P-type. However, the first region 18 may be of P-type conductivity while both the third and second regions 22 and 20 are of N-type conductivity without changing the effect of the operation of the device 10. Also, the third region 22 may be of the same conductivity type as the first region 18 with the second region 20 being of an opposite conductivity type, so that the junction 26 is the P-N junction. Again the effect of the operation of the device 10 is the same even though the conductivities of the regions has been changed. The grid electode 28 has been depicted as being on the incident surface 14, however the grid electrode 28 can extend into the first region 18 so as to more efficiently collect current generated in the third region 22, and reduce series resistance of the device 10. The grid electrode 18 can extend as far into the first region 18 as the heterojunction 24 as long as heterojunction 24 is not also a P-N junction.

Figure 2:
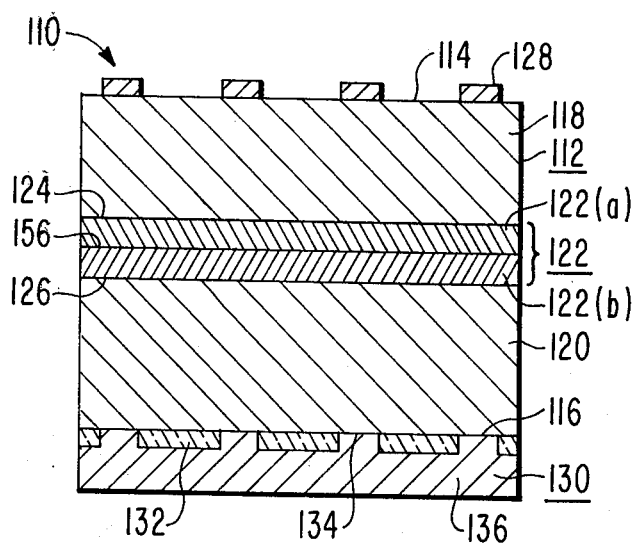
FIG. 2 is a cross-sectional view of a second embodiment of the solar cell device of the present invention.

Referring to FIG. 2 a second embodiment of the solar cell device of the present invention is designated as 110. The solar cell device 110 is similar to the solar cell 10 shown in FIG. 1 in that it includes a body 112 of semiconductor material having a solar radiation incident surface 114 and a surface 116 opposite the incident surface 114. At the incident surface 114 is a first region 118 with a second region 120 spaced from the first region 118 at the opposite surface 116. Between and contiguous to both the first and second regions 118 and 120 is a third region 122. The junctions 124 and 126 between the third region 122 and each of the first and second regions 118 and 120, respectively, are heterojunctions. On the incident surface 114 is a grid electrode 128. On the opposite surface 116 is a reflecting electrode 130. The reflecting electrode includes a non-continuous insulating layer 132 on the surface 116 having opening 134 in the form of a grid pattern with a metallic layer 136 in the openings 134 and on the non-continuous insulating layer 132.

However, the solar cell device 110 of the second embodiment differs from the solar cell 10 in that the third region 122 is formed of two contiguous layers 122(a) and 122(b) of opposite conductivity type. The first layer 122(a) is contiguous to and of the same conductivity type as the first region 118 at the heterojunction 124. The second layer 122(b) is contiguous to and of the same conductivity type as the second region 120 at the heterojunction 126. Thus, the junction 156 between the two layers 122(a) and 122(b) of the third region 122 is the P-N junction. The third region 122 of the cell 110 is like the third region 22 of cell 10 in that it is substantially uniform in composition and is preferably of GaAs.

The operation of the solar cell devices 10 and 110 are essentially the same, with the second region 120 and reflecting electrode 130 providing the cell 110 with the ability of reflecting unabsorbed solar radiation back into the third region 122. An advantage of the second embodiment over the first embodiment is that the average minority carrier generated in the third region 122 will generally travel less of a distance to a P-N junction than minority carriers generated in the third region 22 of the first embodiment. That is to say, if the thickness of the third region 122 between heterojunctions 124 and 126 is approximately the same as the thickness of the third region 22 between heterojunctions 24 and 26, on the average a minority carrier will be generated in the first and second layers 122(a) and 122(b) of the third region 122 closer to a P-N junction, i.e., P-N junction 156, than minority carrier generated in the third region 22, i.e., minority carrier in region 22 must travel to either heterojunction 24 or heterojunction 26, which ever is also the PN junction, in order to create an electrical current. Reducing the distance a minority carrier must travel to a PN junction will increase the collection efficiency and consequently the overall efficiency of the solar cell device. In the operation of the solar cell device 110 the potential barrier at both heterojunction 124 and heterojunction 126 acts to repel minority carrier generated in the first and second layers 122(a) and 122(b), respectively, toward the PN junction 156.

The operation of the solar cell device 110 is substantially the same with the first region 118 and first layer 122(a) of N type conductivity, and the second region 120 and second layer 122(b) of P type conductivity, or with the conductivities as described being reversed.

As for the fabrication of the second embodiment it is the same as that described for the first embodiment, except that forming the third region 122 entails first epitaxially growing a second layer 122(b) and then the first layer 122(a) on the second layer 122(b).

The solar cell devices 10 and 110 of the present invention provides for reflecting unabsorbed solar radiation back into the device thereby increasing the efficiency of the device.

We claim:
1. A solar cell device comprising:
a body of semiconductor material having an incident surface a portion of which is exposed so as to allow solar radiation to enter said body, a surface opposite said incident surface, a first region of one conductivity type at said incident surface, a second region of an opposite conductivity type spaced from said first region, a third region between and contiguous to each of said first and second regions, said third region forming a P-N junction in said body, a solar radiation reflecting electrode on said opposite surface, said third region being of a material of substantially uniform composition and of a lower bandgap energy than either said first or second region so that the junctions between said third region and each of said first and second regions are heterojunctions, said first region being of a material having a bandgap energy greater than 2.1 eV thereby being substantially transparent to solar radiation, and said second region is of a material having a bandgap energy in the range of 1.5 eV to 1.9 eV.

2. The solar cell device in accordance with claim 1 wherein said third region is of the same conductivity as the second region and said third region and said first region having said P-N junction therebetween.

3. The solar cell device in accordance with claim 2 wherein said first region is of N-type conductivity and said second and third regions are of P-type conductivity.

4. The solar cell device in accordance with claim 1 wherein said third region is of a semiconductor material having a bandgap energy in the range of 1.4 eV.

5. The solar cell device in accordance with claim 4 wherein said third region is of gallium arsenide, GaAs, said first region is of aluminum gallium arsenide, $Al_xGa_{1-x}As$, where $0.5<x<1$ and said second region is of aluminum gallium arsenide, $Al_yGa_{1-y}As$ where $y$ is in the range of 0.1 to 0.4.

6. The solar cell device in accordance with claim 1 wherein said third region is of the same conductivity as the first region, and said third region and said second region having said P-N junction therebetween.

7. The solar cell device in accordance with claim 6 wherein said first and third region are of P-type conductivity and said second region is of N-type conductivity.

8. The solar cell device in accordance with claim 1 wherein said radiation reflecting electrode comprises a non-continuous insulating layer on said opposite surface having openings in the form of a grid pattern, and a metallic layer in the openings at said opposite surface and on said insulating layer.

9. The semiconductor device in accordance with claim 8 further comprising an electrode on said incident surface in the form of a grid pattern.

10. The solar cell device in accordance with claim 1 wherein said third region comprises a first layer of one conductivity type in contact with a second layer of the opposite conductivity type with said P-N junction therebetween, said first layer is in contact with said first region and said second layer is in contact with said second region.

11. The solar cell device in accordance with claim 10 wherein said first layer is of the same conductivity type as said first region and said second layer is of the same conductivity type as said second region.

* * * * *